United States Patent
Liu et al.

(10) Patent No.: US 12,396,294 B2
(45) Date of Patent: Aug. 19, 2025

(54) LED DEVICES, LED STRUCTURES AND MANUFACTURING METHODS THEREOF

(71) Applicant: ENKRIS SEMICONDUCTOR, INC., Jiangsu (CN)

(72) Inventors: Weihua Liu, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 371 days.

(21) Appl. No.: 18/250,531

(22) PCT Filed: Nov. 13, 2020

(86) PCT No.: PCT/CN2020/128629
§ 371 (c)(1),
(2) Date: Apr. 25, 2023

(87) PCT Pub. No.: WO2022/099599
PCT Pub. Date: May 19, 2022

(65) Prior Publication Data
US 2024/0014344 A1   Jan. 11, 2024

(51) Int. Cl.
*H01L 33/06* (2010.01)
*H01L 33/00* (2010.01)
(Continued)

(52) U.S. Cl.
CPC .... *H10H 20/812* (2025.01); *H10H 20/01335* (2025.01); *H10H 20/816* (2025.01); *H10H 20/8252* (2025.01)

(58) Field of Classification Search
CPC ........... H10H 20/812; H10H 20/01335; H10H 20/01; H10H 20/816; H10H 20/8252;
(Continued)

(56) References Cited

U.S. PATENT DOCUMENTS

2007/0181869 A1   8/2007   Gaska et al.
2015/0115223 A1   4/2015   Kwak et al.

FOREIGN PATENT DOCUMENTS

CN   101694858 A   4/2010
CN   105789394 A   7/2016
(Continued)

OTHER PUBLICATIONS

State Intellectual Property Office of the People's Republic of China, Office Action and Search Report Issued in Application No. 202080106692, Feb. 8, 2025, 15 pages. (Submitted with Machine Translation).

(Continued)

*Primary Examiner* — Nikolay K Yushin
(74) *Attorney, Agent, or Firm* — The Small Patent Law Group LLC; Christopher R. Carroll

(57) ABSTRACT

A manufacturing method for the LED structure, including: growing a first conductive-type semiconductor layer on a substrate; growing an active layer on the first conductive-type semiconductor layer, where the active layer includes a potential well layer, an insertion layer and a potential barrier layer that are stacked, the insertion layer includes a first insertion layer and a second insertion layer that are stacked, a quantum confinement Stark effect is generated between the first insertion layer and the potential well layer, the materials of the potential well layer, the first insertion layer and the potential barrier layer are all group III-V semiconductor materials, and the material of the second insertion layer includes Si—N bonds for repairing V-type defects of the first insertion layer; and growing a second conductive-type semiconductor layer on the active layer, where the first conductive-type semiconductor layer and the second conductive-type semiconductor layer have opposite conductivity types.

13 Claims, 3 Drawing Sheets

(51) Int. Cl.
  *H10H 20/01* (2025.01)
  *H10H 20/812* (2025.01)
  *H10H 20/816* (2025.01)
  *H10H 20/825* (2025.01)
(58) Field of Classification Search
  CPC .......................... H10H 20/825; H10H 20/815; H01L 25/0753; H01L 25/075; H01L 25/167
  See application file for complete search history.

(56) References Cited

FOREIGN PATENT DOCUMENTS

| CN | 108231965 A | 6/2018 |
|---|---|---|
| CN | 110957401 A | 4/2020 |
| CN | 111403565 A | 7/2020 |
| JP | 2009152552 A | 7/2009 |
| WO | 2010009735 A2 | 1/2010 |

OTHER PUBLICATIONS

You Yuting, "Study on Improving Light-emitting Efficiency of GaN-Based Light-emitting Diode by Optimization of MQW Barrier structures", Science and Technology Innovation Herald, 2013 No. 09, 4 pages. (Submitted with abstract Translation).

ISA State Intellectual Property Office of the People's Republic of China, International Search Report Issued in Application No. PCT/CN2020/128629, Aug. 18, 2021, WIPO, 4 pages.

ISA State Intellectual Property Office of the People's Republic of China, Written Opinion of the International Searching Authority Issued in Application No. PCT/CN2020/128629, Aug. 18, 2021, WIPO, 6 pages. (Submitted with Machine/ Partial Translation).

LED DEVICES, LED STRUCTURES AND MANUFACTURING METHODS THEREOF

CROSS REFERENCE TO RELATED APPLICATIONS

This application is a US National Phase of a PCT Application No. PCT/CN2020/128629 filed on Nov. 13, 2020, the entire contents of which are incorporated herein by reference in their entireties.

TECHNICAL FIELD

The present disclosure relates to the technical field of semiconductors, in particular to LED devices, LED structures and manufacturing methods for the LED structures.

BACKGROUND

In recent years, light emitting diodes (LEDs), as a new generation of green light sources, are widely used in lighting, backlight, display and other fields.

Currently, a light emitting diode includes a P-type semiconductor layer, an active layer, and an N-type semiconductor layer that are stacked. The N-type semiconductor is configured to provide electrons, and the P-type semiconductor is configured to provide holes. Electrons provided by the N-type semiconductor and holes provided by the P-type semiconductor can combine in the active layer, thereby generating light. However, the photoelectric performance of the light emitting diode is easily degraded.

SUMMARY

The purpose of the present disclosure is to provide LED devices, LED structures and methods for preparing the LED structures, which can prevent the photoelectric performance of the light emitting diode from being reduced.

According to one aspect of the present disclosure, a manufacturing method of an LED structure is provided, including:
  growing a first-conductivity-type semiconductor layer on a substrate;
  growing an active layer on the first-conductivity-type semiconductor layer, where the active layer includes a potential well layer, an insertion layer and a barrier layer that are stacked, the insertion layer includes at least one first insertion layer and at least one second insertion layer that are stacked, a quantum confinement Stark effect is produced between the first insertion layer and the potential well layer; materials of the potential well layer, the first insertion layer and the barrier layer are all III-V semiconductor materials, and a material of the second insertion layer includes Si—N bond to repair V-shaped defects in the first insertion layer; and
  growing a second-conductivity-type semiconductor layer on the active layer, where the conductivity types of the first-conductivity-type semiconductor layer and the second-conductivity-type semiconductor layer are opposite.

In some embodiments, a material of the potential well layer is InGaN, a material of the barrier layer is GaN, a material of the first insertion layer is AlGaN or AlInGaN, and a material of the second insertion layer is selected from at least one of SiN, Si-doped AlGaN, Si-doped GaN and Si-doped AlN.

In some embodiments, the Si—N bond in the second insertion layer is implemented by feeding a silicon source into a reaction chamber, and the silicon source includes at least one of silane or disilane.

In some embodiments, the insertion layer is obtained by:
  feeding Al source, Ga source, ammonia gas and carrier gas into a reaction chamber at a same time to grow the first insertion layer; and
  feeding the Al source, the Ga source, Si source, the ammonia gas and the carrier gas into the reaction chamber at a same time to grow the second insertion layer, such that the material of the second insertion layer is Si-doped AlGaN.

In some embodiments, the insertion layer is obtained by:
  feeding Al source, Ga source, ammonia gas and carrier gas into a reaction chamber at a same time to grow the first insertion layer; and
  cutting off the Al source and the Ga source, and feeding Si source, the ammonia gas and the carrier gas into the reaction chamber to grow the second insertion layer, such that the material of the second insertion layer is SiN.

In some embodiments, the insertion layer is obtained by:
  feeding Al source, Ga source, ammonia gas and carrier gas into a reaction chamber at a same time to grow the first insertion layer; and
  cutting off the Al source, and feeding the Ga source, Si source, the ammonia gas and the carrier gas into the reaction chamber at a same time to grow the second insertion layer, such that the material of the second insertion layer is Si-doped GaN.

In some embodiments, the insertion layer is obtained by:
  feeding Al source, Ga source, ammonia gas and carrier gas into a reaction chamber at a same time to grow the first insertion layer; and
  cutting off the Ga source, and feeding the Al source, Si source, the ammonia gas and the carrier gas into the reaction chamber at a same time to grow the second insertion layer, such that the material of the second insertion layer is Si-doped AlN.

In some embodiments, a ratio of a molar rate of the Si source to a molar rate of the Ga source is from $1/10^7$ to $1/10^5$.

In some embodiments, a ratio of a growth time of the second insertion layer to a growth time of the insertion layer is from 1/100 to 1/5.

According to one aspect of the present disclosure, an LED structure is provided, including:
  an active layer including a potential well layer, an insertion layer and a barrier layer that are stacked, where the insertion layer includes at least one first insertion layer and at least one second insertion layer that are stacked, a quantum confinement Stark effect is produced between the first insertion layer and the potential well layer; materials of the potential well layer, the first insertion layer and the barrier layer are all III-V semiconductor materials, and a material of the second insertion layer includes Si—N bond to repair V-shaped defects in the first insertion layer.

In some embodiments, a material of the potential well layer is InGaN, a material of the barrier layer is GaN, a material of the first insertion layer is AlGaN or AlInGaN, and a material of the second insertion layer is selected from at least one of SiN, Si-doped AlGaN, Si-doped GaN and Si-doped AlN.

In some embodiments, the insertion layer includes a plurality of the first insertion layers and a plurality of the second insertion layers, the first insertion layers and the second insertion layers are arranged alternately.

According to one aspect of the present disclosure, there is provided an LED device, including the above-mentioned LED structure.

Figure 1:
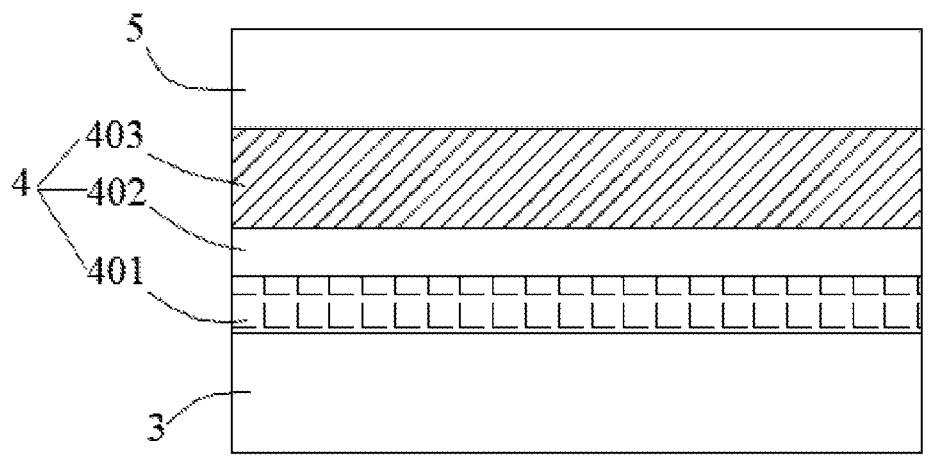
FIG. 1 is a schematic diagram of a light emitting diode in a related art.

DESCRIPTION OF REFERENCE NUMERALS 1. substrate; 2. buffer layer; 3. first-conductivity-type semiconductor layer; 4. active layer; 401. potential well layer; 402. insertion layer; 4021. first insertion layer; 4022. second insertion layer; 403. barrier layer; 5. second-conductivity-type semiconductor layer.

DETAILED DESCRIPTION OF THE EMBODIMENTS

Exemplary embodiments will be described in detail herein, examples of which are illustrated in the accompanying drawings. Where the following description refers to the drawings, the same numerals in different drawings refer to the same or similar elements unless otherwise indicated. Embodiments described in the illustrative examples below are not intended to represent all embodiments consistent with the present disclosure. Rather, they are merely embodiments of devices consistent with some aspects of the present disclosure as recited in the appended claims.

Terms used in the present disclosure is only for the purpose of describing particular embodiments and is not intended to limit the present disclosure. Unless otherwise defined, the technical terms or scientific terms used in the present disclosure shall have the ordinary meanings understood by those skilled in the art to which the present disclosure belongs. "First", "second" and similar words used in the present disclosure and claims do not indicate any sequence, quantity or importance, but are only used to distinguish different components. Likewise, words like "a" or "one" do not indicate a limitation of quantity, but mean that there is at least one. "Multiple" or "several" means two or more. Unless otherwise indicated, terms such as "front", "rear", "lower" and/or "upper" are only used for convenience of description and are not intended to limit to a position or an orientation in space. "Include", "comprise" and similar terms mean that the elements or items listed before "Include" or "comprise" include the elements or items listed after "Include" or "comprise" and their equivalents, and do not exclude other elements or objects. Words such as "connect" or "couple" are not limited to physical or mechanical connections, and may include electrical connections, whether direct or indirect. As used in the present disclosure and the appended claims, the singular forms "a", "said" and "the" are intended to include the plural forms as well, unless the context clearly dictates otherwise. It will also be understood that the term "and/or" as used herein refers to and includes any and all possible combinations of one or more of the associated listed items.

In the related art, as shown in FIG. 1, a light emitting diode (LED) includes a first-conductivity-type semiconductor layer 3, an active layer 4 and a second-conductivity-type semiconductor layer 5 that are stacked. The active layer 4 includes a potential well layer 401 and a barrier layer 403. A material of the potential well layer 401 is InGaN, and a material of the barrier layer 403 is GaN. In order to enable the light emitting diode to generate light with a longer wavelength, the content of the In component in the potential well layer 401 is often increased, and AlGaN is used to form an insertion layer 402 between the potential well layer 401 and the barrier layer 403. A quantum confinement Stark effect (QCSE) is generated between the insertion layer 402 and the potential well layer 401, which narrows the band gap of the potential well, so as to increase the wavelength of the generated light. However, a lattice constant of the crystal orientation of the material of the potential well layer 401 is relatively large, a lattice constant of the crystal orientation of the material of the insertion layer 402 is relatively small, and a larger lattice mismatch exists between the material of the insertion layer 402 and the material of the potential well layer 401, leading to poor lattice quality of the epitaxially grown insertion layer 402 and generating V-type defects. As a thickness of the insertion layer 402 increases, the V-type defects in the material of the insertion layer 402 will be bigger and form pits or holes, causing the In component in the material of the potential well layer 401 to decompose, separate out and escape during the subsequent high-temperature epitaxial growth process, which affects the uniformity of the In composition, and at the same time, reduces the content of the In composition in the material of the potential well layer 401, thereby reducing the photoelectric performance of the light emitting diode (LED).

Embodiment 1

Figure 2:
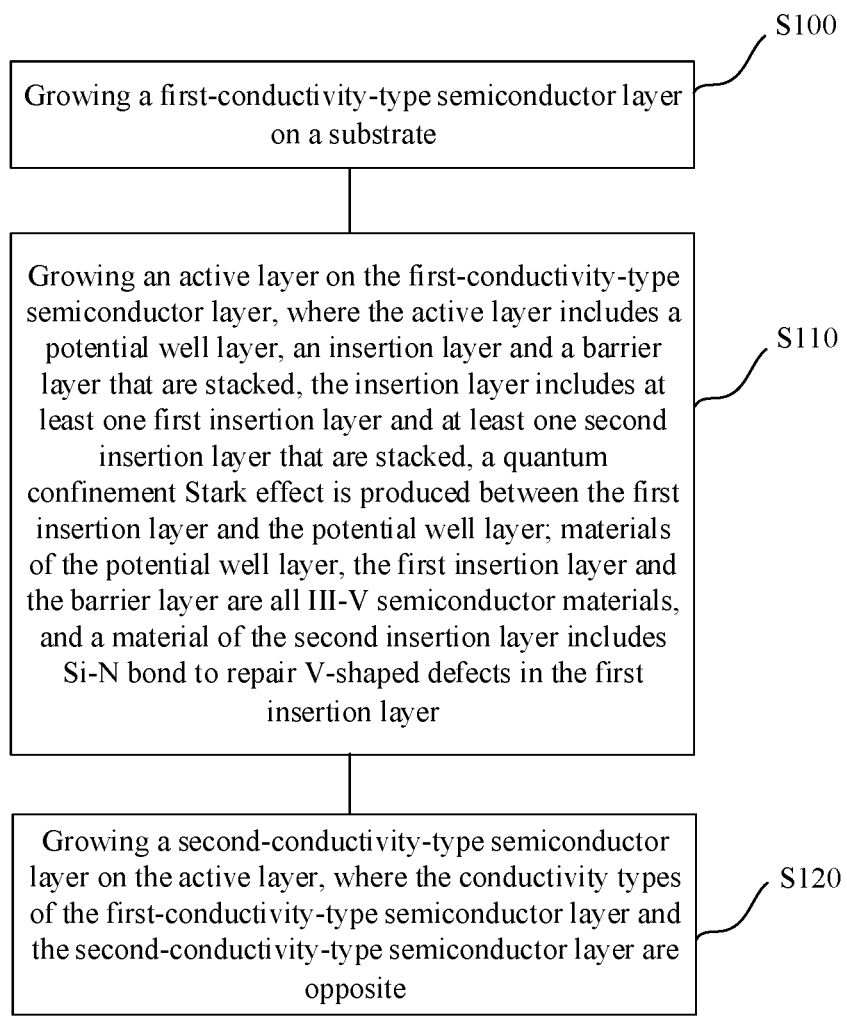
FIG. 2 is a flowchart of a manufacturing method for an LED structure according to Embodiment 1 of the present disclosure.
Figure 3:
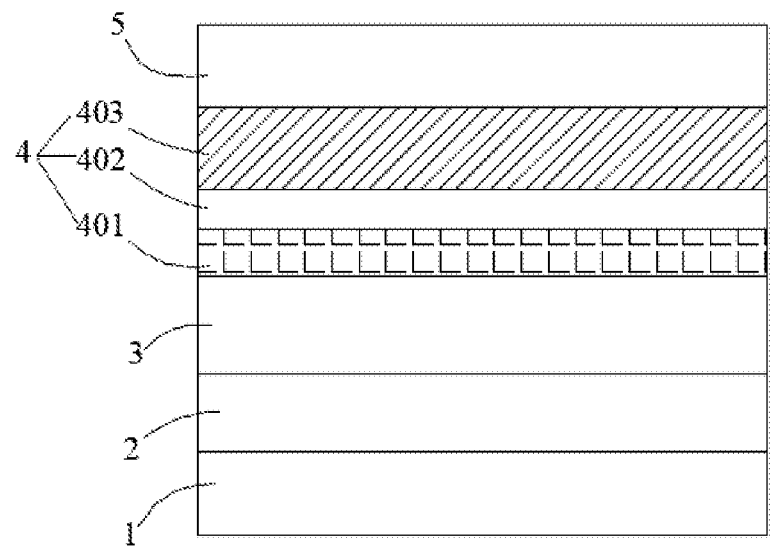
FIG. 3 is a schematic diagram of the LED structure according to Embodiment 1 of the present disclosure.
Figure 4:
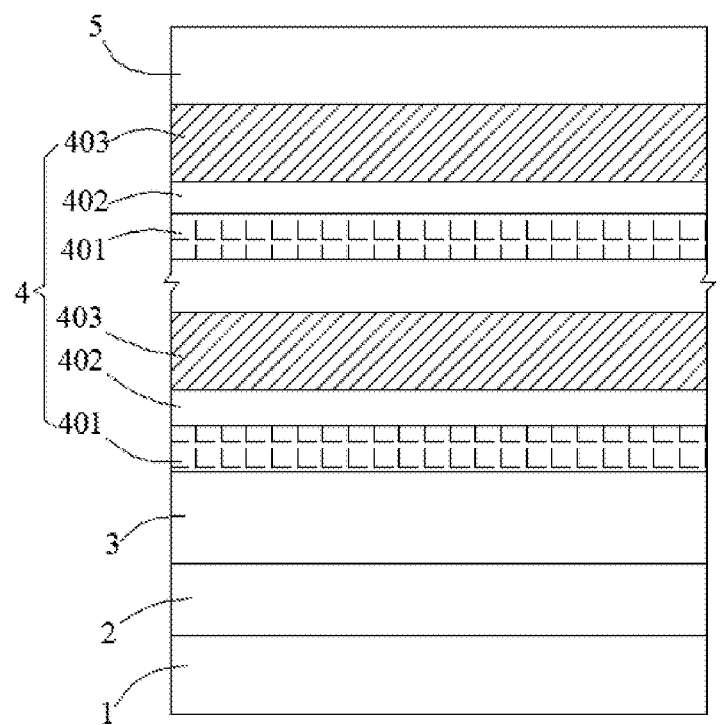
FIG. 4 is another schematic diagram of the LED structure according to Embodiment 1 of the present disclosure.
Figure 5:
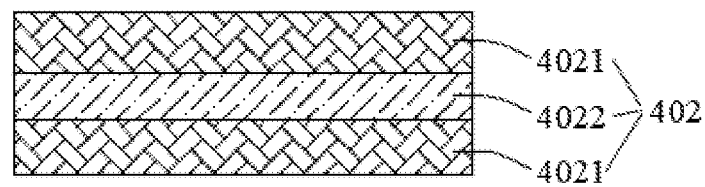
FIG. 5 is a schematic diagram of an insertion layer in the LED structure according to Embodiment 1 of the present disclosure.

FIG. 2 is a flowchart of a manufacturing method for an LED structure according to Embodiment 1 of the present disclosure. FIGS. 3 and 4 are schematic diagrams of the LED structure according to Embodiment 1 of the present disclosure. FIG. 5 is a schematic diagram of an insertion layer in the LED structure according to Embodiment 1 of the present disclosure.

As shown in FIG. 2, the manufacturing method for the LED structure according to Embodiment 1 may include step S100 to step S120.

In step S100, a first-conductivity-type semiconductor layer is grown on a substrate.

In step S110, an active layer is grown on the first-conductivity-type semiconductor layer, where the active layer includes a potential well layer, an insertion layer and a barrier layer that are stacked, the insertion layer includes a first insertion layer and a second insertion layer that are stacked, a quantum confinement Stark effect is produced between the first insertion layer and the potential well layer; a material of the potential well layer, the first insertion layer and the barrier layer are all III-V semiconductor materials, and a material of the second insertion layer includes Si—N bond, used to repair V-shaped defects in the first insertion layer.

In step S120, a second-conductivity-type semiconductor layer is grown on the active layer, the conductivity types of the first-conductivity-type semiconductor layer and the second-conductivity-type semiconductor layer are opposite.

For the manufacturing method of the LED structure of this embodiment, as shown in FIGS. 3 to 5, the active layer 4 includes a potential well layer 401, an insertion layer 402 and a barrier layer 403 that are stacked, the insertion layer includes a first insertion layer 4021 and a second insertion 4022 layer that are stacked, a quantum confinement Stark effect is produced between the first insertion layer 4021 and the potential well layer 401, and the Si—N bond in the material of the second insertion layer 4022 can repair the V-shaped defects in the first insertion layer 4021 formed by the lattice mismatch between the material of the first insertion layer 4021 and the material of the potential well layer 401. Therefore, the problem of photoelectric performance reduction of the light emitting diode caused by the lattice mismatch between the first insertion layer 4021 and the potential well layer 401 in the related art can be relieved, and the photoelectric performance of the light emitting diode can be prevented from being degraded.

The steps of this embodiment are described in detail below:

In step S100, a first-conductivity-type semiconductor layer is grown on a substrate.

As shown in FIG. 3, the substrate 1 may be one of a sapphire substrate 1, a silicon carbide substrate 1 and a silicon substrate 1, which is not limited in this embodiment. In addition, in this embodiment, a buffer layer 2 may further be formed on the substrate 1 before forming the first-conductivity-type semiconductor layer 3. The first-conductivity-type semiconductor layer 3 can be grown on the buffer layer 2. The first-conductivity-type semiconductor layer 3 can be formed in a reaction chamber, and the formation process can includes: atomic layer deposition (ALD), chemical vapor deposition (CVD), molecular beam epitaxy (MBE), plasma enhanced chemical vapor deposition (PECVD), low pressure chemical vapor deposition (LPCVD), metal organic compound chemical vapor deposition, or a combination thereof. Both the buffer layer 2 and the first-conductivity-type semiconductor layer 3 may be III-V group semiconductor materials, such as GaN or the like. The material of the first-conductivity-type semiconductor layer 3 may be N-type GaN.

In step S110, an active layer is grown on the first-conductivity-type semiconductor layer, where the active layer includes a potential well layer, an insertion layer and a barrier layer that are stacked, the insertion layer includes a first insertion layer and a second insertion layer that are stacked, a quantum confinement Stark effect is produced between the first insertion layer and the potential well layer; a material of the potential well layer, the first insertion layer and the barrier layer are all III-V semiconductor materials, and a material of the second insertion layer includes Si—N bond, used to repair V-shaped defects in the first insertion layer.

As shown in FIG. 3, the active layer 4 may be a single quantum well structure, which includes a potential well layer 401, an insertion layer 402 and a barrier layer 403. Of course, as shown in FIG. 4, the active layer 4 can also be a multi quantum well structure, in which potential well layers 401 and barrier layers 403 are arranged alternately, and the insertion layer 402 is provided between any adjacent potential well layer 401 and barrier layer 403. The material of the potential well layer 401 may be InGaN, and the material of the barrier layer 403 may be GaN, which is not limited in the embodiments of the present disclosure. The formation process of the potential well layer 401 and the potential barrier layer 403 can refer to the formation process of the first-conductivity-type semiconductor layer 3.

As shown in FIG. 5, the insertion layer 402 includes first insertion layers 4021 and a second insertion layer 4022 that are stacked. The top and the bottom of the insertion layer 402 are both the first insertion layer 4021. A quantum confinement Stark effect (QCSE) is generated between the first insertion layer 4021 and the potential well layer 401, which narrows the band gap of the potential well, so as to increase the wavelength of the generated light. The material of the first insertion layer 4021 may be AlGaN or AlInGaN. The material of the second insertion layer 4022 may be Si-doped AlGaN. Taking the material of the potential well layer 401 as InGaN as an example, the Si—N bond in the material of the second insertion layer 4022 can repair the V-shaped defects in the first insertion layer 4021 formed by the lattice mismatch between the material of the first insertion layer 4021 and the material of the potential well layer 401, preventing the V-shaped defects from forming pits or holes, and preventing the In component in the material of the potential well layer 401 from decomposing and separating out during the subsequent high-temperature epitaxial growth process.

As shown in FIG. 5, the formation process of the first insertion layers 4021 and the second insertion layer 4022 can refer to the formation process of the first-conductivity-type semiconductor layer 3. The Si—N bond in the second insertion layer 4022 is implemented by feeding a silicon source into the reaction chamber. The silicon source may include silane and/or disilane, which is not limited in the embodiments of the present disclosure. For example, taking the material of the first insertion layer 4021 as AlGaN as an example, the growth method of the insertion layer 402 may include: feeding an Al source, a Ga source, ammonia gas and carrier gas into the reaction chamber at the same time to grow the first insertion layer 4021; and feeding Al source, Ga source, Si source, ammonia gas and carrier gas into the reaction chamber at the same time to grow the second insertion layer 4022. The ratio of the molar rate of feeding the Si source to the molar rate of feeding the Ga source can be from $1/10^7$ to $1/10^5$, such as $1/10^7$, $1/10^6$, $1/10^5$ and so on. The ratio of the growth time for the second insertion layer 4022 to the growth time for the insertion layer 402 may be from 1/100 to 1/5, such as 1/100, 1/60, 1/20, 1/5 and so on. In some examples, the ratio of the molar rate of feeding the Si source to the molar rate of feeding the Ga source during the growth of the first insertion layer 4021 may be from $1/10^7$ to $1/10^5$. The molar rate of feeding the Ga source during the growth of the first insertion layer 4021 may be the same as the molar rate of feeding the Ga source during the growth of the second insertion layer 4022.

In step S120, a second-conductivity-type semiconductor layer is grown on the active layer, where the conductivity types of the first-conductivity-type semiconductor layer and the second-conductivity-type semiconductor layer are opposite.

As shown in FIG. 3 and FIG. 4, the second-conductivity-type semiconductor layer 5 may be an III-V group semiconductor material, such as GaN or the like. Taking the material of the first-conductivity-type semiconductor layer 3 as N-type GaN as an example, the material of the second-conductivity-type semiconductor layer 5 may be P-type GaN. The formation process of the second-conductivity-type semiconductor layer 5 can refer to the formation process of the first-conductivity-type semiconductor layer 3.

As shown in FIGS. 3 to 5, the LED structure manufactured in this embodiment may include an active layer 4. The active layer 4 may include a potential well layer 401, an insertion layer 402 and a barrier layer 403 that are stacked. The insertion layer 402 includes first insertion layers 4021 and a second insertion layer 4022 sandwiched in the first insertion layers 4021, and a quantum confinement Stark effect occurs between the first insertion layer 4021 and the potential well layer 401. Materials of the potential well layer 401, the first insertion layer 4021 and the barrier layer 403 may include III-V semiconductor materials. The material of the second insertion layer 4022 contains Si—N bond, which is used to repair the V-shaped defects in the first insertion layer 4021.

Embodiment 2

The LED structure and the manufacturing method of the LED structure in Embodiment 2 of the present disclosure are substantially the same as the LED structure and the manufacturing method of the LED structure in Embodiment 1 of the present disclosure, the difference only lies in the growth method of the insertion layer and the material of the second insertion layer in the insertion layer. The material of the second insertion layer in the LED structure of Embodiment 2 of the present disclosure may be Si-doped GaN, and the growth method of the insertion layer may include: feeding Al source, Ga source, ammonia gas and carrier gas into the reaction chamber at the same time to grow the first insertion layer; and cutting off the Al source, and feeding Ga source, Si source, ammonia gas and carrier gas into the reaction chamber at the same time to grow the second insertion layer.

Embodiment 3

The LED structure and the manufacturing method of the LED structure in Embodiment 3 of the present disclosure are substantially the same as the LED structure and the manufacturing method of the LED structure in Embodiment 1 of the present disclosure, the difference only lies in the growth method of the insertion layer and the material of the second insertion layer in the insertion layer. The material of the second insertion layer in the LED structure of Embodiment 3 of the present disclosure may be Si-doped AlN, and the growth method of the insertion layer may include: feeding Al source, Ga source, ammonia gas and carrier gas into the reaction chamber at the same time to grow the first insertion layer; and cutting off the Ga source, and feeding Al source, Si source, ammonia gas and carrier gas into the reaction chamber at the same time to grow the second insertion layer.

Embodiment 4

The LED structure and the manufacturing method of the LED structure in Embodiment 4 of the present disclosure are substantially the same as the LED structure and the manufacturing method of the LED structure in Embodiment 1 of the present disclosure, the difference only lies in the growth method of the insertion layer and the material of the second insertion layer in the insertion layer. The material of the second insertion layer in the LED structure of Embodiment 4 of the present disclosure may be Si-doped SiN, and the growth method of the insertion layer may include: feeding Al source, Ga source, ammonia gas and carrier gas into the reaction chamber at the same time to grow the first insertion layer; and cutting off Al source and Ga source, and feeding Si source, ammonia gas and carrier gas into the reaction chamber at the same time to grow the second insertion layer.

Embodiment 5

Figure 6:
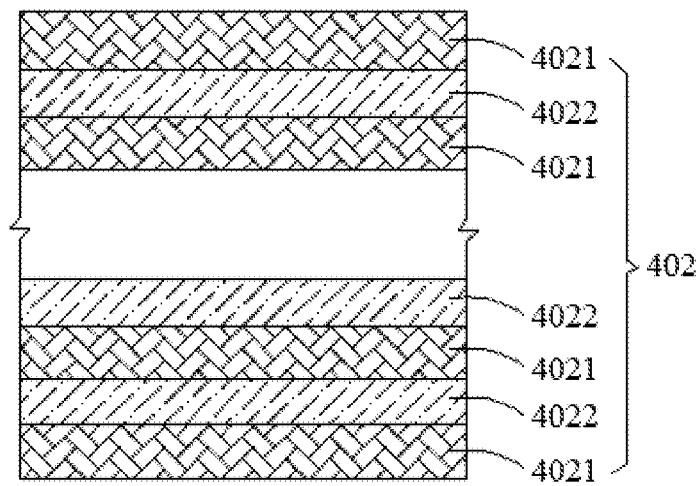
FIG. 6 is a schematic diagram of an insertion layer in an LED structure according to Embodiment 5 of the present disclosure.

FIG. 6 is a schematic diagram of an insertion layer in an LED structure according to Embodiment 5 of the present disclosure; The LED structure and the manufacturing method of the LED structure in Embodiment 5 of the present disclosure are substantially the same as the LED structure and the manufacturing method of the LED structure in any one of Embodiments 1 to 4 of the present disclosure, except for the structure of the insertion layer. As shown in FIG. 6, the insertion layer 402 according to Embodiment 5 of the present disclosure may include a plurality of first insertion layers 4021 and a plurality of second insertion layers 4022, and the first insertion layers 4021 and the second insertion layers 4022 are arranged alternately. Where the number of the second insertion layer 4022 may be 2-20, such as 2, 4, 6, 9, 17, 20 and so on. The materials of the second insertion layers 4022 are all the same.

Embodiment 6

The LED structure and the manufacturing method of the LED structure of Embodiment 6 of the present disclosure are substantially the same as the LED structure and the manufacturing method of the LED structure of Embodiment 5 of the present disclosure. The differences are that the second insertion layers in Embodiment 6 of the present disclosure include at least two second insertion layers with different materials, and the material of any second insertion layer is selected from one of SiN, Si-doped AlGaN, Si-doped GaN and Si-doped AlN.

Embodiment 7

Embodiment 7 of the present disclosure provides an LED device. The LED device may include the LED structure in any one of Embodiments 1 to 6. The LED device may further include a first electrode electrically connected to the first-conductivity-type semiconductor layer and a second electrode electrically connected to the second-conductivity-type semiconductor layer. Since the LED structure included in the LED device according to Embodiment 7 of the present disclosure is the same as the LED structure in the above-mentioned embodiments, it has the same beneficial effects, which are not repeated here.

The above descriptions are only the preferred embodiments of the present disclosure, and are not intended to limit the present disclosure in any form. Although the present disclosure is disclosed as above in the preferred embodiments, the preferred embodiments are not used to limit the present disclosure. Any person skilled in the art, without departing from the scope of the technical solution of the present disclosure, may use the technical content disclosed above to make some changes or modifications to get equivalent embodiments with equivalent changes, but contents that do not depart from the technical solution of the present disclosure, and any simple modifications, equivalent changes and modifications made to the above embodiments based on the technical essence of the present disclosure still fall within the scope of the technical solutions of the present disclosure.

The invention claimed is:

1. A manufacturing method of an LED structure, comprising:
   growing a first-conductivity-type semiconductor layer on a substrate;
   growing an active layer on the first-conductivity-type semiconductor layer, wherein the active layer includes a potential well layer, an insertion layer and a barrier layer that are stacked, the insertion layer includes at least one first insertion layer and at least one second insertion layer that are stacked, a quantum confinement Stark effect is produced between the first insertion layer and the potential well layer; materials of the potential well layer, the first insertion layer and the barrier layer are all III-V semiconductor materials, and a material of the second insertion layer includes Si—N bond to repair V-shaped defects in the first insertion layer; and
   growing a second-conductivity-type semiconductor layer on the active layer, wherein the conductivity types of the first-conductivity-type semiconductor layer and the second-conductivity-type semiconductor layer are opposite.

2. The manufacturing method of the LED structure according to claim 1, wherein the Si—N bond in the second insertion layer is implemented by feeding a silicon source into a reaction chamber, and the silicon source comprises at least one of silane or disilane.

3. The manufacturing method of the LED structure according to claim 1, wherein a material of the potential well layer is InGaN, a material of the barrier layer is GaN, a material of the first insertion layer is AlGaN or AlInGaN, and a material of the second insertion layer is selected from at least one of SiN, Si-doped AlGaN, Si-doped GaN and Si-doped AlN.

4. The manufacturing method of the LED structure according to claim 3, wherein the insertion layer is obtained by:
   feeding Al source, Ga source, ammonia gas and carrier gas into a reaction chamber at a same time to grow the first insertion layer; and
   cutting off the Al source and the Ga source, and feeding Si source, the ammonia gas and the carrier gas into the reaction chamber to grow the second insertion layer, such that the material of the second insertion layer is SiN.

5. The manufacturing method of the LED structure according to claim 3, wherein the insertion layer is obtained by:
   feeding Al source, Ga source, ammonia gas and carrier gas into a reaction chamber at a same time to grow the first insertion layer; and
   cutting off the Al source, and feeding the Ga source, Si source, the ammonia gas and the carrier gas into the reaction chamber at a same time to grow the second insertion layer, such that the material of the second insertion layer is Si-doped GaN.

6. The manufacturing method of the LED structure according to claim 3, wherein the insertion layer is obtained by:
   feeding Al source, Ga source, ammonia gas and carrier gas into a reaction chamber at a same time to grow the first insertion layer; and
   cutting off the Ga source, and feeding the Al source, Si source, the ammonia gas and the carrier gas into the reaction chamber at a same time to grow the second insertion layer, such that the material of the second insertion layer is Si-doped AlN.

7. The manufacturing method of the LED structure according to claim 3, wherein the insertion layer is obtained by:
   feeding Al source, Ga source, ammonia gas and carrier gas into a reaction chamber at a same time to grow the first insertion layer; and
   feeding the Al source, the Ga source, Si source, the ammonia gas and the carrier gas into the reaction chamber at a same time to grow the second insertion layer, such that the material of the second insertion layer is Si-doped AlGaN.

8. The manufacturing method of the LED structure according to claim 7, wherein a ratio of a molar rate of the Si source to a molar rate of the Ga source is from $1/10^7$ to $1/10^5$.

9. The manufacturing method of the LED structure according to claim 7, wherein a ratio of a growth time of the second insertion layer to a growth time of the insertion layer is from 1/100 to 1/5.

10. An LED structure, comprising:
    an active layer including a potential well layer, an insertion layer and a barrier layer that are stacked, wherein the insertion layer comprises at least one first insertion layer and at least one second insertion layer that are stacked, a quantum confinement Stark effect is produced between the first insertion layer and the potential well layer; materials of the potential well layer, the first insertion layer and the barrier layer are all III-V semiconductor materials, and a material of the second insertion layer comprises Si—N bond to repair V-shaped defects in the first insertion layer.

11. The LED structure according to claim 10, wherein a material of the potential well layer is InGaN, a material of the barrier layer is GaN, a material of the first insertion layer is AlGaN or AlInGaN, and a material of the second insertion layer is selected from at least one of SiN, Si-doped AlGaN, Si-doped GaN and Si-doped AlN.

12. The LED structure according to claim 10, wherein the insertion layer comprises a plurality of the first insertion layers and a plurality of the second insertion layers, the first insertion layers and the second insertion layers are arranged alternately.

13. An LED device, comprising the LED structure according to claim 10.

* * * * *